United States Patent [19]

Guinda et al.

[11] Patent Number: 4,980,801

[45] Date of Patent: Dec. 25, 1990

[54] PROTECTION MODULE FOR A CONTACT-MAKER ELECTROMAGNET

[75] Inventors: Santos Guinda, Evreux; Pierre J. Decelle, Val de Reuil, both of France

[73] Assignee: La Telemecanique Electrique, France

[21] Appl. No.: 353,931

[22] Filed: May 19, 1989

[30] Foreign Application Priority Data

May 20, 1988 [FR] France ................................ 88 06766

[51] Int. Cl.[5] ......................... H05K 5/00; H01H 67/02

[52] U.S. Cl. ...................................... 361/394; 335/132

[58] Field of Search ............. 200/51 R; 439/352, 353, 439/354; 335/131, 132, 18; 361/393, 394, 18

[56] References Cited

U.S. PATENT DOCUMENTS

| | | | |
|---|---|---|---|
| 3,197,583 | 7/1965 | Goodwin, Jr. et al. | 200/51 R |
| 3,238,329 | 3/1966 | Russo | 3335/132 |
| 3,949,333 | 4/1976 | Freitag et al. | 335/132 |
| 4,644,308 | 2/1987 | Guery et al. | 335/132 |
| 4,691,978 | 9/1987 | Lemmer | 200/51 R |

*Primary Examiner*—Steven L. Stephan
*Assistant Examiner*—Nilay H. Vyas
*Attorney, Agent, or Firm*—William A. Drucker

[57] ABSTRACT

A protection module is provided for a contact-maker electromagnet. The resistive and capacitive elements of an RC circuit for protecting a contact-maker against parasites are disposed in an insulating module having two projecting receptacles connected together by a third flat receptacle which has passing therethrough connection conductors, two of which are extended by pins adapted for cooperating resiliently with free portions of the terminals of the coil.

5 Claims, 3 Drawing Sheets

PROTECTION MODULE FOR A CONTACT-MAKER ELECTROMAGNET

BACKGROUND OF THE INVENTION

1. Field of the Invention

The invention relates to an electric contact-maker apparatus having, on the one hand, a housing of general prismatic shape with a rectangular base, adapted for receiving an electromagnet and which comprises side walls matching the contour thereof while leaving two external cavities in the vicinity of parallel edges and, on the other hand, a removable electric module whose case is associated with the housing and two electric connection pieces of which are connected respectively to two terminals for the external connection of the coil of this electromagnet.

2. Description of the Prior Art

Such apparatus, which have the property of providing, for example, protection of the coil against voltage surges appearing at its terminals by means of an RC network, also benefit from a substantial reduction of the level of the parasites which accompany energization and/or deenergization of this coil; in this connection their use is either recommended or prescribed when electronic apparatus sensitive to such parasites are in the immediate vicinity of or are exposed to radiation emitted by conductors passing close by.

The user, who must take the above-mentioned precautions, generally meets modules which may be associated with a standard contact-maker by being clamped thereto, either on the front portion of a part of the housing, or else placed between the base of the housing and a plate intended for fixing same.

In the first case, the volume occupied by this module reduces that which may be used for positioning auxiliary contact blocks which are generally secured to this same front face.

In the second case, the need to dispose such a protection module, subsequently, requires removal of the contact-maker for disengaging it from its fixing plate; this operation generally results in a loss of time to the extent that the bundles of conductors connected to the different terminals of the contact-maker make it difficult to have access to the fixing screws or, respectively, to the hook for hooking it on to a standardized shaped rail.

In another approach, known for example from the patent EP 198 099, the housing of the protection module is removably housed in a compartment opening on to a side face of the contact-maker, and the necessary electric connections are provided by resilient lugs applied on conducting pieces which extend between the terminals for connection of the coil and other resilient pieces which are fast with the carcase of this coil.

Apart from the disadvantages due to the need to manufacture and fit these additional conducting pieces, such an arrangement may be further reproached with the resulting impossibility of positioning such a module when required after a multiplicity of contact-makers have been fitted and fixed against each other; the only approach permitting such positioning would be to systematically leave, between two adjacent contact-makers, a gap greater than the thickness of the case of the module : finally, the adjacent side faces of two contact-maker apparatus are those which are generally chosen for receiving a reciprocal locking device when two adjacent contact-makers are associated in a change-over circuit, so that trouble-shooting at this position could also require dismantling of this device.

A protected contact-maker is also known, for example from the model of utility DE 82 36 682, in which the presence of a clearance in the housing of this contact-maker is used for housing a protection module; the fact that the electric connection and subsequent positioning of this module require loosening of the connection terminals of the coil, may be felt as a hindrance or a risk when these terminals are not adjacent for, on the one hand, the simultaneous insertion of two conductors or more in a connection terminal is never easy whereas, on the other hand, mechanical holding of the module in position may in the long run result in exaggerated fatigue of the single connection lug serving for this purpose.

SUMMARY OF THE INVENTION

Consequently, the invention proposes making improvements to an apparatus having the above-mentioned construction which are likely to overcome the aforesaid drawbacks.

In accordance with the invention, this object is attained because the case of the removable module comprises, on the one hand, a first flat shaped receptacle whose internal volume has passing therethrough portions of coplanar conducting pieces connected to components of the module and, on the other hand, two second projecting receptacles which are adapted to receive these components and whose dimensions and spacing permit insertion into two cavities opening on to the same face of the housing of the contact-maker adjacent the terminals.

BRIEF DESCRIPTION OF THE DRAWINGS

The invention will be better understood from the following description and accompanying figures, which illustrate respectively.

DESCRIPTION OF THE PREFERRED EMBODIMENTS

Figure 1:
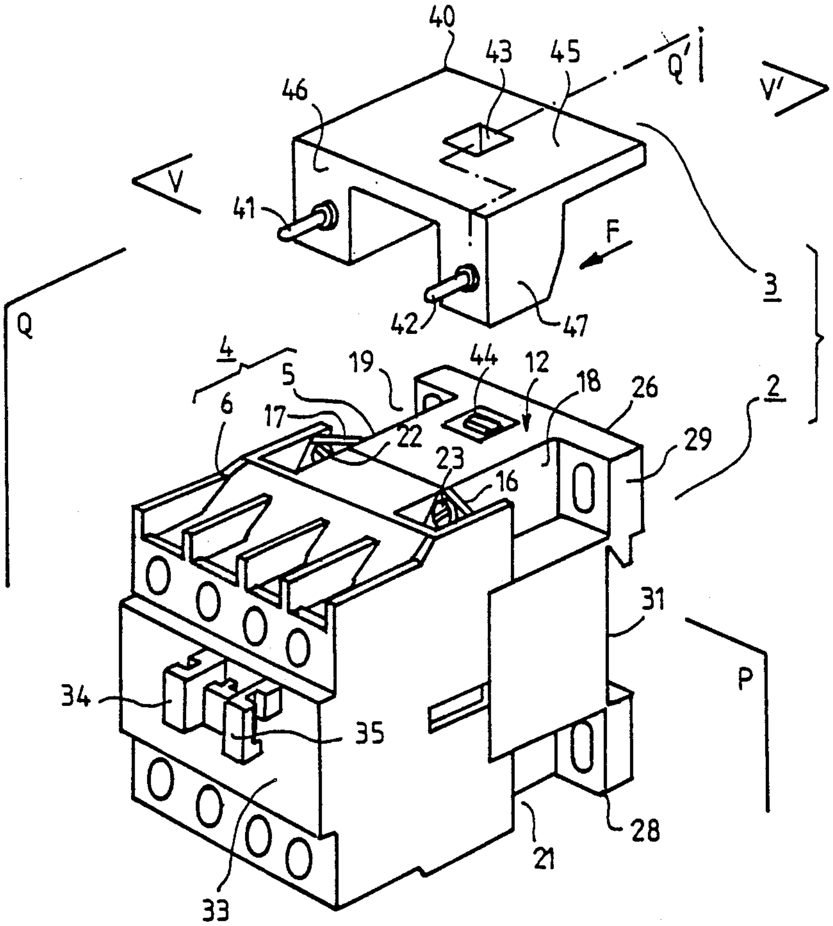
FIG. 1, a perspective front view of a contact-maker apparatus in accordance with the invention in which the protection module has been dissociated from the housing thereof.

A protected contact-maker 1, shown in FIG. 1, results from the mechanical and electric association of a contact-maker such as 2 and a protection module 3.

Figure 2:
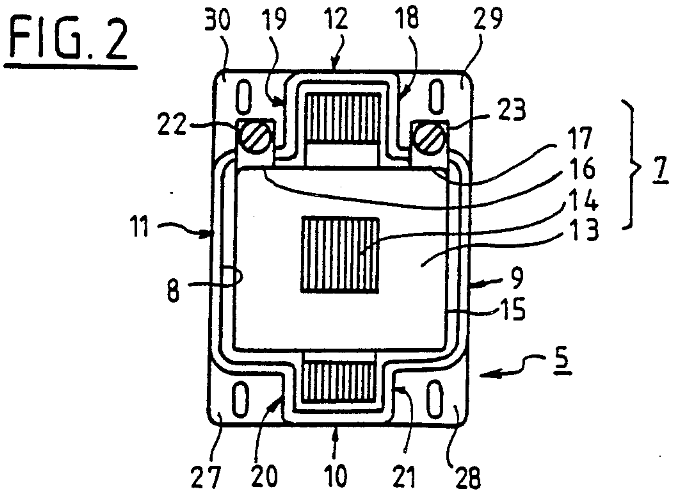
FIG. 2, a sectional view of a contact-maker apparatus through plane P, defined in FIG. 1.

The contact-maker apparatus usually comprises a housing 4 formed by the association of a base 5 and a cover 6; the base serves essentially for receiving an electromagnet such as 7, see FIG. 2, which is housed in an internal volume 8 whose walls or partitions 9, 10, 11, 12 define the limits; these walls match the contours of a fixed yoke 14 and a coil 13 having two connection terminals 16, 17 on its carcase 15.

These terminals, which are placed substantially facing one of the two pairs of cavities 18, 19 or, respectively, 20, 21, resulting from the above mentioned measure, are further situated substantially at the level of a junction plane P along which the cover and the base are associated, so that their clamping screws 22, 23 are accessible from outside, see FIG. 1.

Figure 3:
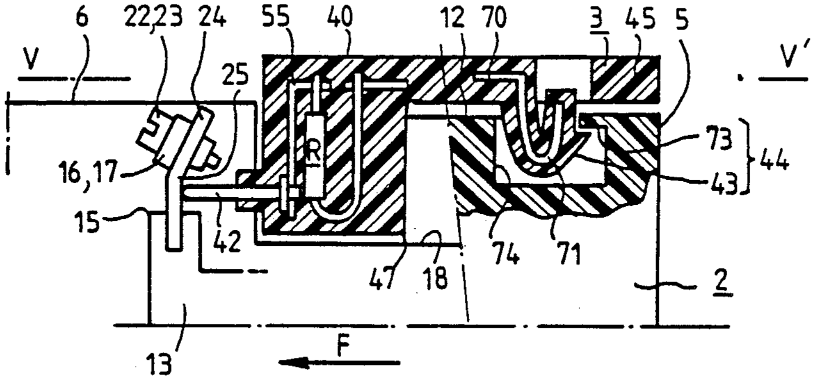
FIG. 3, a partial sectional view of the protection module and of the region of the contact-maker with which it is associated, through the jagged plane QQ', shown in FIG. 1.

These screws are each engaged in a metal conducting piece such as 24, see FIG. 3, which has a region 25 accessible from the adjacent cavity such as 18 and which is anchored in the carcase.

A flange 26 of the base further has, see FIG. 1, lugs such as 27, 28, 29, 30 which serve for directly fixing to a plate, whereas a recess 31 is provided with attachment means known per se for attaching the contact-maker to a standardized rail known under the name of "profiled hat".

A front face 33 of the cover has, in a way also known per se, hooks 34, 35 for holding auxiliary contact blocks not shown.

The protection module 3, which includes for example a circuit comprising in series a resistor R and a capacitor C, comprises essentially a case 40, see FIG. 1, for receiving these elements, two conducting pieces or projecting pins 41, 42 and retention means 43 which attach it to the housing of the contact-maker. For this, the upper partition 12 of base 5 has for its part means 44 cooperating with the preceding ones 43.

As can be seen from this figure, case 40 comprises a first receptacle 45 having a flat shape and two second projecting receptacles 46, 47 which are substantially more voluminous.

The spacing apart or the distance separating these two second receptacles, and their lengths measured in the direction of arrow F, are chosen so as to correspond to those of the two cavities 18, 19 of base 5 in which these receptacles are inserted when the module 3 is associated with the contact-maker.

During such association, the pins will come into resilient electric contact with terminal pieces of the coil, as can be seen in FIG. 3 for one of them and in which the arrow F indicates the direction in which a contact pressure force is exerted.

Figure 4:
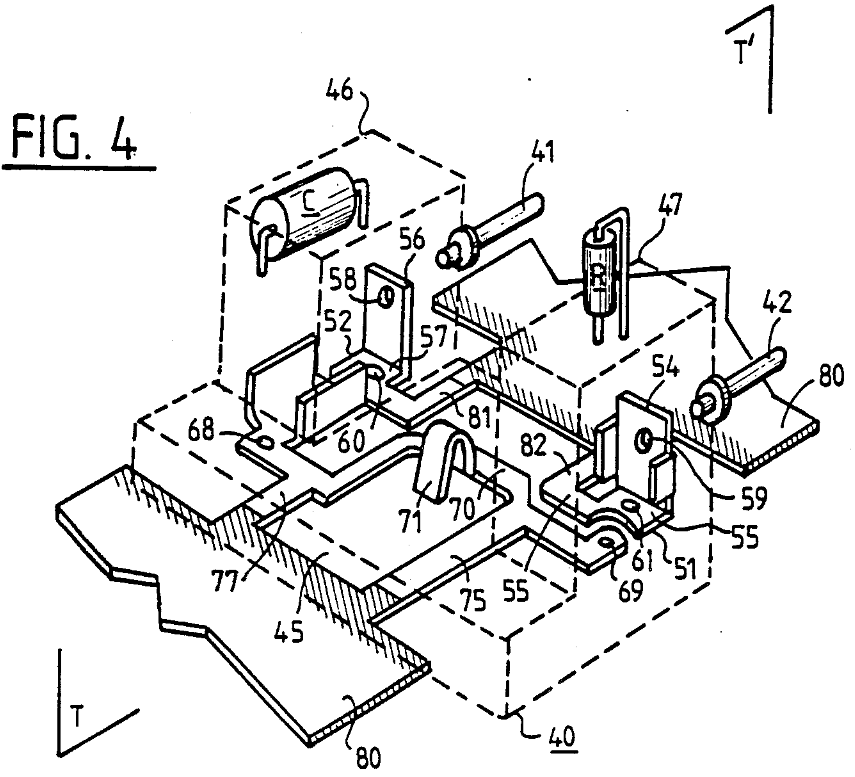
FIG. 4, a perspective view of the parts contained in a protection module case as well as metal strip portions which connect them together during a manufacturing step.

Referring to FIG. 4, where the protection module is shown in a position turned through 180° with respect to its position shown in FIG. 1, it can be seen that the internal volume of case 40 receives two conducting pieces 51, 52, pressed from a metal sheet of small thickness.

Two pieces 51, 52 are each in the form of a right-angled bracket with legs 54, 55, respectively 56, 57; the first legs 54, 56 and the second legs 55, 57 are provided with openings 58, 59, respectively 60, 61, serving, for the first pair, to receive riveted nipples belonging to pins 42, 41 and, for the second pair, to receive and have soldered thereto the first connection conductors belonging to resistor R and, respectively, to capacitor C. Second connection conductors of these two elements are intended to be inserted and soldered in openings 68, 69 belonging to a flat conducting connection piece 70 which is pressed out and extends transversely with respect to F.

This piece 70 as well as the second legs 55, 57 are placed substantially in the same common plane which is parallel to the two pins; these latter are preferably parallel to each other.

As can be understood from the broken line contour which shows in an exaggerated way the general shape of case 40, the coplanar parts and part portions 70, 55, 57 are housed in the first receptacle 45 of small thickness, whereas capacitor C and leg 56, on the one hand, and resistor R and leg 54, on the other, are disposed respectively in each of the second receptacles 46 and respectively 47.

FIG. 4 further shows that the connection piece 70 comprises substantially in its central region a hoop 71 situated in a median plane TT' perpendicular to the common plane.

This hoop, which is resilient because of the nature of the material chosen for forming piece 70, is intended to communicate to a deformable hook 43 fast with case 40 a force in a direction opposite to F which will tend to apply pins 41, 42 against the terminal pieces such as 25 by bearing on a heel 73 of base 5, see FIG. 3, or of the partition 12. The screws 22, 23 of these terminals 17 remain then perfectly accessible, said electromagnet having a contour, for connection of other conductors to the corresponding contact zones.

This heel, which forms part of the retention means 44, may be advantageously disposed in an appropriately shaped compartment 74 which opens on to partition 12 of the base.

Case 40 of protection module 3 could be formed from two half cases whose junction plane would pass substantially through a median plane VV' parallel to the pins of the first receptacle, one of these elements then playing substantially the role of a lid.

In another particularly advantageous embodiment, the case is molded over the conductors and the electric components during a special operation, which is preceded by a step in which the electric components are positioned and soldered to the conductors which connect them together.

Figure 5:
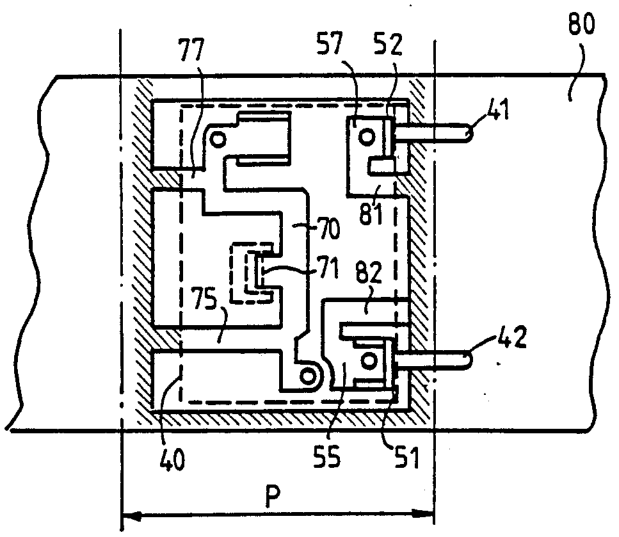
FIG. 5, a top view of a metal strip from which conducting parts of the module are stamped out, bent and held in position, with an advancing step -p- before a molding operation is carried out.

During this step, and during this molding operation, the different conducting pieces 51, 52, 70 are kept at appropriate relative distances due to the existence of extensions such as 75, 77, respectively 81, 82, which connect them to a metal strip 80 whose continuity is ensured after the portions to be eliminated between the pieces of the same module have been pressed out, for example by means of longitudinal portions external to the module see FIG. 5.

During this molding operation, hook 43 will be advantageously formed about hoop 71 so as to benefit from the resilience thereof; however, a hook such as 43 could be integrally molded with the material of the case, if the latter has the required properties.

The portions of parallel extensions 77, 75 and 81, 82, see the shaded regions in FIG. 4, will then be removed during a subsequent pressing operation which will only leave a very thin conducting layer on the surface during step by step advance of the strip by a value P, see also FIG. 5.

If required, these conducting portions may be insulated by sticking an adhesive ribbon or strip portion to the wall of the case.

In another insulating mode, the internal portions of extensions 75, 77, 81 and 82 may be given sufficiently small cross sections so that tractive forces exerted on their ends in direction F and in the direction opposite to F cause internal breakage; the residual gaps may then be readily closed up.

What is claimed is:

1. An electric contact maker apparatus comprising:

(i) a housing of general prismatic shape having a base which encloses an electromagnet having a coil electrically connected to two connecting terminals externally accessible, said base comprising a bottom wall provided with means for fixing the housing on a support element, a front face located opposite to said bottom and on which a cover can be assembled, four side walls matching a contour of the electromagnet and forming therebetween four angular regions, and two prismatic cavities formed in two respective angular regions which are adjacent to a determined one of said side walls, said connecting terminals each comprising an associated electrically conducting element accessible from one of said cavities, and (ii) a removable electronic module having a substantially U-shaped case which comprises a flat receptacle and two projections spaced apart from each other which extend from two respective opposite lateral regions of said flat receptacle and whose dimensions and spacing permit their respective insertion into the said cavities, in an assembled position of the module, said projections enclosing electronic components and the flat receptacle having an internal volume lodging portion of coplanar conducting pieces connected to said components, each of said projections further comprising an external electrical connecting means which is located so as to engage the electrically conducting element of one of said connecting terminals in the assembled position of the module.

2. The contact-maker apparatus as claimed in claim 1, wherein the coplanar conducting pieces lodged in the flat receptacle further comprise two bent portions each extending in a projection and bearing on the external electrical connecting means of this projection.

3. The contact-maker apparatus as claimed in claim 2, wherein said external electrical connecting means consists of an electrical pin.

4. The contact-maker apparatus as claimed in claim 2, wherein said connecting terminals each comprise a clamping zone distant from its associated conducting element.

5. The contact-maker apparatus as claimed in claim 3, wherein one of said coplanar conducting pieces comprises an external resilient bent lug located so as to bear on a heel of the said housing in the said assembled position and to exert on the module a force causing the pins to be applied on the electrically conducting elements.

* * * * *